Nov. 17, 1970 D. T. KAN 3,541,355
CIRCUIT FOR SELECTIVELY PRODUCING OUTPUT PULSES OF OPPOSITE
POLARITY IN RESPONSE TO INPUT PULSES OF A SIMILAR POLARITY
Filed Dec. 28, 1967
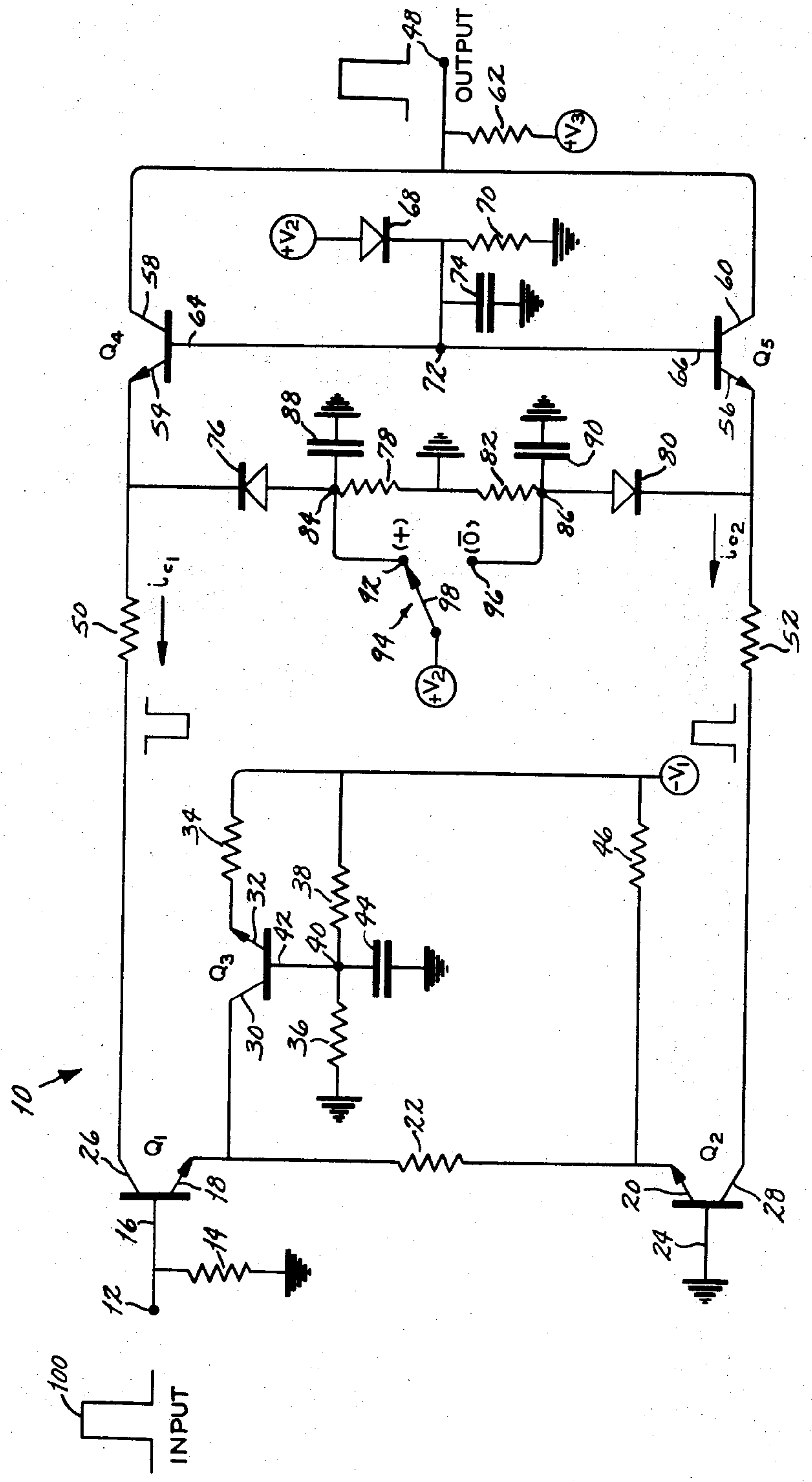
INVENTOR
DAVID T. KAN
BY Harold A. Dillon
ATTORNEY United States Patent Office 3,541,355
Patented Nov. 17, 1970

3,541,355

CIRCUIT FOR SELECTIVELY PRODUCING OUTPUT PULSES OF OPPOSITE POLARITY IN RESPONSE TO INPUT PULSES OF A SIMILAR POLARITY

David T. Kan, Fort Lee, N.J., assignor to Monsanto Company, St. Louis, Mo., a corporation of Delaware Filed Dec. 28, 1967, Ser. No. 694,215
Int. Cl. H03k 1/12
U.S. Cl. 307—262 7 Claims

ABSTRACT OF THE DISCLOSURE

A polarity selection circuit including a differential amplifier whose outputs are coupled to an output terminal by means of a solid state signal translating switching circuit. The switching circuit includes transistors having diodes connected thereto for the purpose of selectively rendering the transistors conductive and nonconductive. This is accomplished by apply a D.C. control voltage to the diodes, which in turn renders the associated switching transistor nonconductive and shunts the output from one side of the differential amplifier from the output terminal of the selection circuitry.

The present invention relates generally to a circuit for selecting the polarity of triggering signals, and more particularly to a D.C.-coupled polarity selection circuit which is responsive to a D.C. control signal, which may be operated at high frequencies, and which requires only a single-ended input signal.

Oftentimes triggering circuits for oscilloscopes, and the like, employ differential amplifiers to convert a single-ended signal into a pair of balanced, double-ended signals of opposite polarity. Where it is desirable to select opposite-polarity (positive or negative) signals for driving a single-ended load by means of such a triggering circuit, it has been the general practice to employ a mechanical switch to change the electrical connections between the output terminals of the differential amplifier and the load. Another technique employed has been that of using a switch to selectively apply the single-ended input signal to either of the input terminals of the differential amplifier, and take the output signal from only one of the amplifier stages.

Although such circuits have served the purpose at relatively low frequencies, they have not proved satisfactory under high frequency (say 50 to 150 mHz.) conditions for the reason that the switches contribute undesirable inductance and capacitance to the signal path. The parasitic inductance and capacitance associated with the switches result in serious deterioration of the differential amplifier response, especially at high frequencies.

The general purpose of this invention is to provide a D.C.-coupled polarity selection circuit which embraces all the advantages of heretofore employed polarity selection trigger circuits, yet does not possess the aforedescribed disadvantages. To attain this, the present invention utilizes a unique combination of a pair of switching transistors and a pair of control diodes, the operation of which may be selectively controlled by a D.C. voltage to translate the output signals from a differential amplifier to an output terminal.

An object of the present invention is the provision of a novel polarity selection circuit operable at high frequencies.

Another object of the present invention is to provide a D.C.-coupled polarity selection circuit wherein the polarity of the output signal is controlled by the selected application of a D.C. control voltage to solid-state switching circuits.

In the present invention these purposes (as well as others apparent herein) are achieved generally by providing a differential amplifier circuit whose output signals are coupled to an output terminal by means of transistors connected in the grounded-base configuration. The emitter electrodes of the grounded-base transistors are each connected to one terminal of a D.C. voltage-controlled diode. The other terminal of each D.C. voltage-controlled diode is connected to a biasing circuit. The biasing circuit is capable of selectively applying either a forward or a reverse bias to the diode. By forward biasing either of the D.C. voltage-controlled diodes, the grounded-base transistor associated therewith may be cut off, thereby shunting the output signal from one stage of the differential amplifier from the output terminal and allowing the other to be translated to the output terminal. In this manner the polarity of the signal appearing at the output terminal of the polarity selection circuit may be readily selected without introducing any deleterious inductance or capacitance at high frequencies.

Utilization of the invention will become apparent to those skilled in the art from the disclosures made in the following description of a preferred embodiment of the invention as illustrated in the accompanying single sheet of drawings, which is a schematic circuit diagram of a preferred embodiment of the polarity selection circuit of the present invention.

Referring now to the drawing, there is shown a D.C.-coupled polarity selection circuit, generally designated 10.

THE DIFFERENTIAL AMPLIFIER

The polarity selection circuit 10 includes a pair of NPN transistors Q1 and Q2 which form the transistor pair of a two-stage differential amplifier. The input to the differential amplifier circuit is shown as an input terminal 12, which is directly connected to the base electrode 16 of the transistor Q1 and is further coupled to ground potential through an input resistor 14. The emitter electrode 18 of the transistor Q1 is coupled to the emitter electrode 20 of the transistor Q2 by means of a resistor 22. The base electrode 24 of the transistor Q2 is shown connected directly to ground potential.

The collector electrodes 26 and 28 of the transistors Q1 and Q2, respectively, serve as the output terminals of the two-stage differential amplifier.

An NPN transistor Q3 is shown with its collector electrode 30 connected to the emitter electrode 18 of the transistor Q1. The emitter electrode 32 of transistor Q3 is coupled to a source of negative supply potential $-V_1$ by means of a resistor 34. A voltage divider consisting of resistors 36 and 38 is connected between the negative power supply terminal $-V_1$ and ground potential. The common terminal 40 between resistors 36 and 38 is connected to the base electrode 42 of the transistor Q3 and is further coupled to ground potential by means of a high frequency by-pass capacitor 44. The voltage divider thus provides a substantially constant bias potential to the base electrode of the transistor Q3.

The emitter electrode 20 of transistor Q2 is also coupled to the negative power supply terminal $-V_1$ by means of resistor 46.

THE D.C. VOLTAGE-CONTROLLED SWITCHING CIRCUIT

The collector electrode 26 of the transistor Q1 is coupled to an output terminal 48 of the polarity selection circuit 10 by means of a signal path including a current-limiting resistor 50, and the emitter-collector path of a switching NPN transistor Q4. Similarly the collector electrode 28 of the transistor Q2 is coupled to the output terminal 48 by means of a signal path including a current-limiting resistor 52 and the emitter-collector path of a switching NPN transistor Q5. The emitter electrodes 54 and 56 of the switching transistors Q4 and Q5 are connected directly to the current-limiting resistors 50 and 52, respectively. A positive source of supply potential $+V_3$ is coupled to the collector electrodes 58 and 60 of the transistors Q4 and Q5, respectively, by means of a load resistor 62, across which the output signal from the polarity selection 10 is taken.

The base electrodes 64 and 66 of the transistors Q4 and Q5 are connected to a bias circuit consisting of a positive supply potential $+V_2$, a conventional diode 68, and a resistor 70. The anode electrode of the diode 68 is connected to the power supply terminal $+V_2$, and the cathode electrode is connected to one terminal of the resistor 70. The other terminal of the resistor 70 is connected to ground potential. The bases of the transistors Q4 and Q5 are connected to the junction point 72 between the cathode electrode of the diode 68 and the resistor 70. A high-frequency, by-pass capacitor 74 is connected to couple the junction 72 to ground potential.

A conventional junction, low-capacitance diode 76 has its cathode electrode connected to the emitter electrode 54 of the switching transistor Q4, and its anode electrode coupled to ground potential through a biasing resistor 78. Similarly a second such diode 80 has its cathode electrode connected to the emitter electrode 56 of the switching transistor Q5, and its anode electrode coupled to ground potential through a biasing resistor 82. The junction points 84 and 86 between the anode electrodes of diodes 76 and 80 and their associated resistors 78 and 82 are coupled to A.C. ground by means of high pass capacitors 88 and 90.

The junction point 84 is directly connected to one contact 92 of a double-pole, single-throw switch, generally designated 94. A second contact 96 of the switch 94 is directly connected to the junction point 86. The contact arm 98 of the switch 94 is selectively movable between the contacts 92 and 96 and is directly connected to the source of positive biasing potential $+V_2$.

OPERATION OF THE POLARITY SELECTION CIRCUIT

In operation, a single-ended repetitive signal of a chosen frequency, such as the rectangular pulse 100, is applied to the input terminal 12 of the D.C.-coupled polarity selection circuit 10. The transistors Q1 and Q2 are connected in the conventional differential amplifier configuration with the transistor Q3 serving as a constant current source to balance the magnitudes of the collector signal currents $i_{c1}$ and $i_{c2}$ of the transistors Q1 and Q2. A positive polarity signal, such as that shown applied to the input terminal 12, increases the collector current $i_{c1}$. Assuming that the values of resistors 50 and 52 are substantially equal, it follows from the well known differential amplifier mode of operation that the collector current $i_{c2}$ will decrease a corresponding amount, so that the signals appearing at the collector electrodes 26 and 28 will be 180° out of phase. That is, the voltage signal at col- $i_{c2}$ will decrease a corresponding amount, so that the sig- lector electrode 26 will be inverted from that applied to the input terminal 12, whereas the voltage signal appearing at collector electrode 28 will be in phase and of the same polarity as the input signal applied to input terminal 12.

As may be readily seen, the emitter electrodes 54 and 56 of transistors Q4 and Q5, respectively, are driven by the collector electrodes 26 and 28 of the transistors Q1 and Q2. It follows that the polarity of the signal appearing at the output terminal 48 depends on the state of transistors Q4 and Q5. The output signal will be of negative polarity if transistor Q4 is conducting while transistor Q5 is cut off, or conversely it will be of positive polarity if transistor Q4 is cut off while transistor Q5 is conducting.

Whether transistors Q4 or Q5 are conducting or cut off depends upont the D.C. control voltage applied to the anode electrodes of the diodes 76 and 80. Normally the bias potential applied to the base electrodes 64 and 66 of the transistors Q4 and Q5 is $+V_2$—0.6 volt where diode 68 is chosen to provide an 0.6 volt drop. Therefore, if the anode of diode 76 is connected to the positive supply voltage source $V_2$ by means of the switch 94 as shown, the diode 76 will become forward biased, and the voltage at the emitter electrode 54 of transistor Q4 will become $V_2$—0.6 volt, where diode 76 is chosen to provide a voltage drop of 0.6 volt. It should be noted that the emitter voltage becomes substantially equal to the bias potential applied to the base electrode 64 of the transistor Q4, i.e., $+V_2$—0.6 volt. Thus, the transistor Q4 is rendered nonconductive because its base to emitter voltage is substantially zero. The collector current $i_{c1}$ then flows through the diode 76; it being essentially shunted from the transistor Q4. The collector electrode 26 of transistor Q1 sees an impedance consisting of resistor 50 in series with a relatively small forward diode resistance contributed by diode 76. This forward diode resistance is essentially equal to the grounded base output impedance of a transistor Q4 when it is conducting.

With switch 94 in the position shown, the anode of diode 80 is coupled to ground potential through the resistor 82. Thus, diode 80 is back biased causing the collector current $i_{c2}$ to flow through the emitter-collector path of the transistor Q5. In such instance, the output signal appearing at terminal 48 will have the same polarity as that of the input signal 100.

It should be readily apparent from the foregoing description that when the anode of the D.C. voltage-controlled diode 80 is connected to the positive supply source $V_2$ by means of the switch 94, the diode 80 will become forward biased and the transistor Q5 will cut off, while the transistor Q4 will be returned to its conductive state. In such instance the output signal at terminal 48 will be of opposite polarity to that applied to the input terminal 12. That is, in the embodiment illustrated the positive input signal 100 will be inverted at the collector electrode 26 and translated by means of the emitter-collector path of transistor Q4 to the output terminal 48 to provide a negative polarity trigger signal.

In conclusion, it should be noted that double-ended, opposite-polarity pulses are selectively obtainable at the output terminal 48 of the polarity selection circuitry 10. The polarity selection is achieved without physically switching leads in the signal path. Furthermore, it should be noted that the operation of the differential amplifier transistors Q1 and Q2 is substantially unaffected by the switching of the D.C. control voltage to the anodes of the diodes 76 and 80, because the effective collector impedance of these transistors is the value of the resistors 50 and 52, respectively. The capacitance associated with the switch 94 and the leads connecting the switch to the anodes of the diodes 76 and 80 does not adversely affect the high frequency operation of the circuit 10, because the back based diodes 76 and 80 effectively isolate such capacitance; each contribute no more than a few picofarads capacitance.

Obviously many modifications and variations of the present invention are visible in light of the above teachings. For example, it would be within the skill of one skilled in the art to reverse the polarities of the supply voltages, provided corresponding complementary transistors are substituted for those shown and the diodes are poled in the reverse direction to that illustrated. Therefore, it is to be understood that the invention may be practiced otherwise than as specifically described.

I claim:

1. A D.C.-coupled polarity selection circuit, comprising:

circuit means including at least one input terminal for receiving a single-ended input signal and further including first and second output terminals, said circuit means providing, in response to said single-ended input signal, output signals at said first and second output terminals which are 180° out of phase, an output terminal, first and second switching means respectively coupling said first and second output terminals of said circuit means to said output terminal, first and second diodes connected to shunt said first and second switching means respectively, means for supplying reverse bias to said first and second diodes, and means for selectively applying forward biasing potentials to said first and second diodes, whereby either of the output signals from said circuit means may be selected to appear at said output terminal by selectively applying forward biasing potentials to said first and second diodes.

2. A D.C.-coupled polarity selection circuit, comprising:

circuit means including at least one input terminal for receiving a single-ended input signal and further including first and second output terminals, said circuit means providing, in response to said single-ended input signal, output signals at said first and second output terminals which are 180° out of phase, an output terminal, first and second switching means respectively coupling said first and second output terminals of said circuit means to said output terminal, first and second diodes connected to shunt said first and second switching means respectively, means for supplying reverse bias to said first and second diode, a source of biasing potential, and a double-pole, single-throw switch for selectively applying said biasing potential source to said first and second diodes, whereby either of the output signals from said circuit means may be selected to appear at said output terminal by selectively applying said biasing potential source to said first and second diodes.

3. A D.C.-coupled polarity selection circuit, comprising:

circuit means including at least one input terminal for receiving a single-ended input signal and further including first and second output terminals, said circuit means providing, in response to said single-ended input signal, output signals at said first and second output terminals which are 180° out of phase, an output terminal, first and second switching transistors connected in the grounded-base configuration, said first and second switching transistors coupling said first and second output terminals of said circuit means to said output terminal, first and second diodes connected to shunt said first and second switching transistors respectively, means for supplying reverse bias to said first and second diodes, and means for selectively applying forward biasing potential to said first and second diodes, whereby either of the output signals from said circuit means may be selected to appear at output terminal by selectively applying forward biasing potential to said first and second diodes.

4. A D.C.-coupled polarity selection circuit, comprising:

an input terminal, first and second transistors having their emitter electrodes coupled to a source of a first reference potential, the base of said first transistor being coupled to said input terminal and the base of said second transistor being coupled to a source of a second reference potential, an output terminal, a source of operating potential, first and second switching means respectively coupling the collector electrodes of said first and second transistors to said output terminal and to said source of operating potential, first and second diodes connected in shunt with said first and second switching means respectively, first biasing means connected to said first and second diodes for applying reverse bias thereto, and second biasing means connected to said first and second diodes for selectively applying forward bias thereto, whereby, by selectively applying forward bias to said first and second diodes, double-ended, opposite-polarity signals may be obtained at said output terminal.

5. A D.C.-coupled polarity selection circuit, comprising:

an input terminal, first and second transistors having their emitter electrodes coupled to the source of a first reference potential, the base of said first transistor being coupled to said input terminal and the base of said second transistor being coupled to a source of a second reference potential, an output terminal, a source of operating potential, first and second switching means respectively coupling the collector electrodes of said first and second transistor to said output terminal and to said source of operating potential, first and second diodes connected in shunt with said first and second switching means respectively, first biasing means connected to said first and second diodes for applying reverse bias thereto, and a source of biasing potential, and a double-pole, single-throw switch adapted to selectively connect said biasing potential source to said first and second diodes, whereby, by selectively applying forward bias to said first and second diodes, double-ended, opposite-polarity signal may be obtained at said output terminal.

6. A D.C.-coupled polarity selection circuit, comprising:

an input terminal, first and second transistors having their emitter electrodes coupled to a source of first reference potential, the base of said first transistor being coupled to said input terminal and the base of said second transistor being coupled to a source of a second reference potential, an output terminal, a source of operating potential, first and second transistors connected in the grounded-base configuration, first and second diodes connected in shunt with said first and second transistors respectively, the emitters of said grounded-base transistors being coupled to said first and second diodes and further connected to the collector electrodes of said first and second transistors, first biasing means connected to said first and second diodes for applying reverse bias thereto, and second biasing means connected to said first and second diode for selectively applying forward bias thereto, whereby, by selectively applying forward bias to said first and second diodes, double-ended, opposite-polarity pulses may be obtained at said output terminal.

7. A D.C.-coupled polarity selection circuit, comprising:

circuit means including at least one input terminal for receiving a single-ended signal and first and second output terminal, said circuit means providing, in response to said single-ended input signal, output signals at said first and second output terminals which are 180° out of phase, an output terminal, first and second transistors, the emitters of said first and second transistors being coupled respectively to said first and second output terminals of said circuit means and the collector electrodes thereof being connected to said output terminal, biasing circuit means connected to the base electrode of said first and second transistors for applying a substantially constant biasing potential thereto, and first and second diodes having one terminal connected to said emitter electrodes of said first and second transistors, the other terminal of said first and second diodes being coupled to a reference potential sufficient to reverse bias said first and second diodes, a source of biasing potential, and a switch for selectively connecting said source of biasing potential to said other terminal of said first and second diodes, whereby the operation of said switch selectively applies forward bias to said first and second diodes and thereby applies a bias potential to the emitter electrodes of said first and second transistors to render them nonconductive.

References Cited

UNITED STATES PATENTS

| | | | |
|---|---|---|---|
| 3,120,615 | 2/1964 | Sheehan | 307—262 |
| 3,172,952 | 3/1965 | Lentz | 328—57 XR |
| 3,222,547 | 12/1965 | Boan et al. | 307—214 |

OTHER REFERENCES

IBM Technical Disclosure Bulletin, vol. 8, No. 2, July 1965, pp. 324, 325, titled Complementary Power Driver, written by J. L. Walsh.

STANLEY T. KRAWCZEWICZ, Primary Examiner

U.S. Cl. X.R.

307—214, 236, 243; 328—55, 57, 153, 155